United States Patent

Wu et al.

Patent Number: 5,844,444
Date of Patent: Dec. 1, 1998

[54] WIDE DYNAMIC INPUT RANGE TRANSCONDUCTOR-BASED AMPLIFIER CIRCUIT FOR SPEECH SIGNAL PROCESSING

[75] Inventors: Chin-san Wu, Nan Da; Chun-hsien Su, Kaohsiung, both of Taiwan

[73] Assignee: Macronix International Co., LTD., Hsinchu, Taiwan

[21] Appl. No.: 800,712

[22] Filed: Feb. 14, 1997

[51] Int. Cl.[6] .................................................. H03G 3/30
[52] U.S. Cl. ............................................. 330/279; 330/85
[58] Field of Search .............................. 330/85, 86, 129, 330/140, 279, 282

[56] References Cited

U.S. PATENT DOCUMENTS

4,610,006  9/1986  MacDonald ........................ 330/279 X
5,063,287  11/1991  Trace et al. ....................... 330/279 X

OTHER PUBLICATIONS

"A Large–Signal Very Low–Distortion Transconductor for High–Frequency Continuous–Time Filters", Jose Silva–Martinez, Michel S.J. Steyaert, and Willy M.C. Sansen, IEEE Journal of Solid–State Circuits, vol. 26, No. 7, Jul. 1991.

Primary Examiner—Steven Mottola

[57] ABSTRACT

A two-opamp gain stage wide dynamic range automatic level control circuit (WDR ALC) for implementation in a speech applications is disclosed. The first gain stage is formed by an inverting opamp with a transconductor device in the feedback loop. The first gain stage produces an output voltage which is coupled to a second gain stage via an ac coupling capacitor. The second gain stage is formed by an inverting opamp which produces the output voltages for the (WDR ALC). A fraction of the first stage's output voltage is fed back to the transconductor device. The transconductor device acts as a voltage controlled resistor that is effectively parallel with the feedback resistor of the first stage opamp. The output voltage of the second stage is fed back to peak detector adapted for speech electronic circuitry applications. The output of the peak detector is compared with a preset peak voltage by a converter which generates the control voltage for the transconductor device. Upon being activated, the transconductor device sinks a fraction of input current that is proportional to the output voltage of the first stage which effectively reduces the gain of the first stage. The gain reduction of the first stage suppresses the output voltage of the second stage to control the over gain of the (WDR ALC). The object of having an automatic level control circuit (ALC) operational over a broad range of input voltages is accomplished by virtue of having the input voltage applied directly to the first gain stage which is not affected by the transconductor device. The relaxation of the dependency of performance of the ALC on a transconductor device results in simplifying the design of the transconductor device.

9 Claims, 4 Drawing Sheets

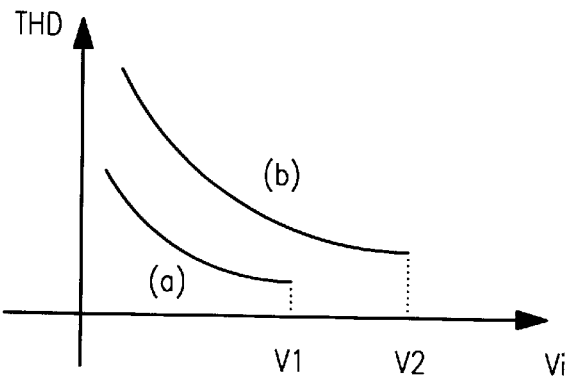
FIG. 3a
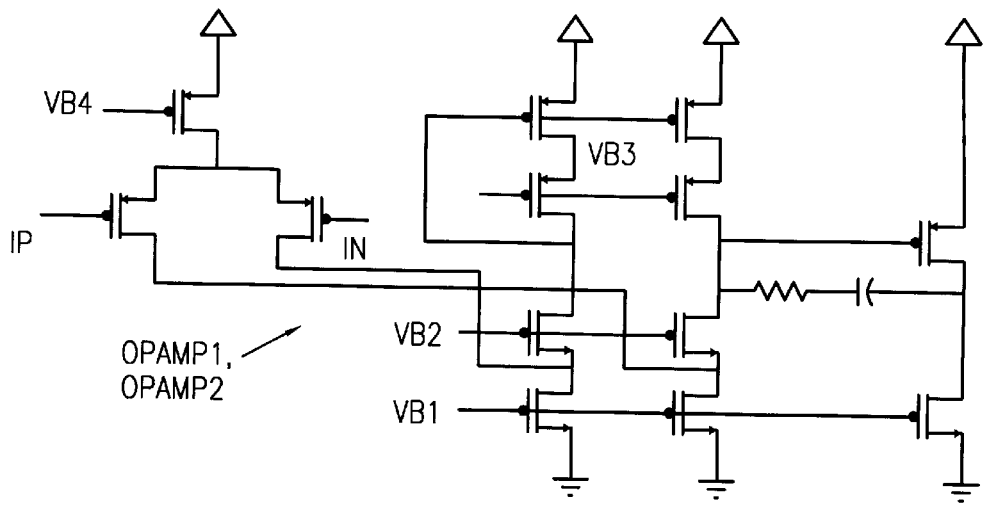
FIG. 4
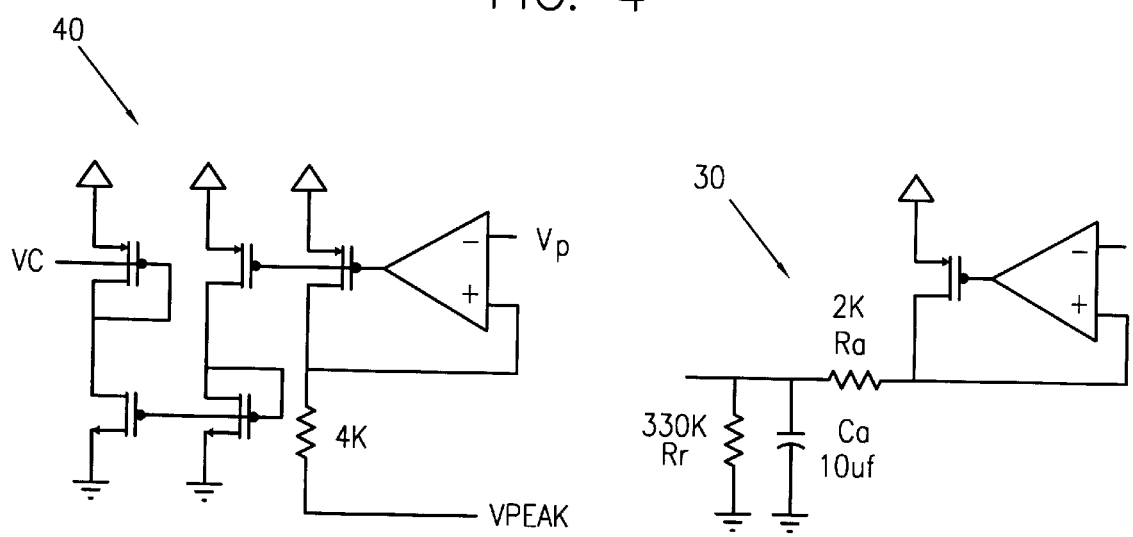
FIG. 5
FIG. 6

WIDE DYNAMIC INPUT RANGE TRANSCONDUCTOR-BASED AMPLIFIER CIRCUIT FOR SPEECH SIGNAL PROCESSING

FIELD OF THE INVENTION

The present invention relates to electronic systems and methods for controlling output voltages for use by electronic circuitry. More particularly, the present invention relates to electronic amplifiers utilizing transconductance integrated circuit devices as basic components. Even more particularly, the present invention relates to electronic amplifier circuits that use voltage controlled transconductors in a feedback loop to avoid input voltage range sensitivity.

DESCRIPTION OF THE PRIOR ART

In the communications field, the electronic signals of speech are produced through transducers, like microphones, or are received from remote areas. The amplitude of these signals vary from below 1 mV to a few volts, depending upon the source of the signal, by example, the different kinds of transducers, the person originating the speech signal, different environments, and other variables in the source that impacts the amplitude of the speech signal. The human ear can tolerate amplitudes in the medium range, by example, a few 10 mill-volts to less than 1 volt. As an observation, if the speech signal is processed by a DSP, an analog-to-digital (A/D) converter with a limited dynamic range would be more cost-effective, Thus, a need is seen to exist for an automatic level control (ALC) gain stage for speech signal processors to control the signal level such that the amplitude variations would be reduced.

A known ALC circuit employs a voltage controlled, integrated circuit (IC), transconductor device in an open loop configuration. This ALC circuit is shown in FIG. 1. This prior art implementation of a voltage controlled transconductor results in the ALC circuit having limited input range response. The Vo/Vi transfer function for the ALC circuit in FIG. 1 is derived as follows:

$$i = Gm_{Vc} * V_i \quad (1)$$

$$V_o = i * R = Gm_{Vc} * V_i * R \quad (2)$$

$$V_o/V_i = Gm_{Vc} * R \quad (3)$$

Where: i=input current to operational amplifier (OPAMP)

$Gm_{Vc}$=voltage controlled transconductance of transconductor device (Gm)

$V_i$=input voltage to transconductor device (Gm)

$V_c$=control voltage for the transconductor device (Gm)

R=feedback resistor for operational amplifier (OPAMP)

Equation (3) shows the dependency of $V_o/V_i$ on the transconductor device (Gm), and equation (2) shows output voltage $V_o$ depending on $V_c$ which controls the performance of the transconductor device (Gm). Further, the transconductor device (Gm) must be of high quality and must be a very linear device since the Gm device is configured in an open loop configuration, see generally an article entitled "A Large-Signal Very Low-Distortion Transconductor for High-Frequency Continuous-Time Filters" by Jose Silva-Martinez, et al., IEEE JSSC, VOL. 26, No. 7, pp. 946–955, July 1991. The transconductance Gm, however, has only a much smaller operating range. As shown in FIG. 1a, when the input signal $V_i$ is larger than around 100 mV, the Gm will be reduced drastically which will result in a distortion component accompanying output voltage signal $V_o$ due to current saturation and Gm=I/V. Meanwhile, the lower the power supply voltage of the Gm device, the smaller the input voltage swings.

Thus, a need is seen to exist for an ALC circuit configuration that utilizes an IC transconductor device, but is not particularly sensitive to fabrication tolerances and the control voltage $V_c$ that impact the linearity of the IC device.

A need is further seen to exist for an ALC circuit configuration that employs an IC transconductor device as a component in the gain stage, but whose $V_o/V_i$ performance is not affected by large swings in the input voltage range, nor by low power supply.

It is therefore a primary object of this invention to provide an ALC circuit configuration that utilizes an IC transconductor device in the gain stage, but is not particularly sensitive to fabrication tolerances and the control voltage $V_c$ that impact the linearity of the IC device.

A related object of the present invention is to provide an ALC circuit configuration that employs an IC transconductor device as a component in the gain stage, but whose $V_o/V_i$ performance is not affected by large swings in the input voltage range, nor by low power supply.

A particular object of the present invention is to provide an ALC circuit configuration, as described in the foregoing objects, for use in speech electronic circuitry applications.

SUMMARY OF THE INVENTION

Accordingly, the foregoing objects are accomplished by providing a gain stage for an auto level control circuit (ALC) that is responsive to wide dynamic voltage ranges of operation. The preferred embodiment is an ALC with wide dynamic range (WDR ALC) that is implemented by two opamp gain stages. The first gain stage is formed by an inverting opamp with a transconductor device in the feedback loop. The first gain stage produces an output voltage which is coupled to a second gain stage via an ac coupling capacitor. The second gain stage is formed by an inverting opamp which produces the output voltages for the (WDR ALC). A fraction of the first stage's output voltage is fed back to the transconductor device. The transconductor device acts as a voltage controlled resistor that is effectively parallel with the feedback resistor of the first stage opamp. The output voltage of the second stage is fed back to a peak detector adapted for speech electronic circuitry applications. The output of the peak detector is compared with a preset peak voltage by a converter which generates the control voltage for the transconductor device. Upon being activated, the transconductor device sinks a fraction of input current that is proportional to the output voltage of the first stage which effectively reduces the gain of the first stage. The gain reduction of the first stage suppresses the output voltage of the second stage to control the total gain of the (WDR ALC). The object of having an automatic level control circuit (ALC) operational over a broad range of input voltages is accomplished by virtue of having the input voltage applied directly to the first gain stage which is not affected by the transconductor device. The relaxation of the dependency of performance of the ALC on a transconductor device results in simplifying the design of the transconductor device.

Other features of the present invention are disclosed or apparent in the section entitled: "Description of the Preferred Embodiment of the Invention".

BRIEF DESCRIPTION OF THE DRAWINGS

For fuller understanding of the present invention, reference is made to the accompanying drawing in the following detailed description of the Description of the Preferred Embodiment of the Invention. In the drawing:

FIG. 3a are graphical representations of total harmonic distortion (THD) versus input voltage swing, illustrating the performance improvement facilitated by WDR ALC, in accordance with the present invention.

FIG. 4 shows a circuit diagram of a two-opamp gain stage as employed in a (WDR ALC) in accordance with the present invention.

FIG. 5 shows a circuit diagram of a voltage peak detector circuit as employed in a (WDR ALC) in accordance with the present invention.

FIG. 6 shows a circuit diagram of a voltage converter as employed in a (WDR ALC) in accordance with the present invention.

Figure 1:
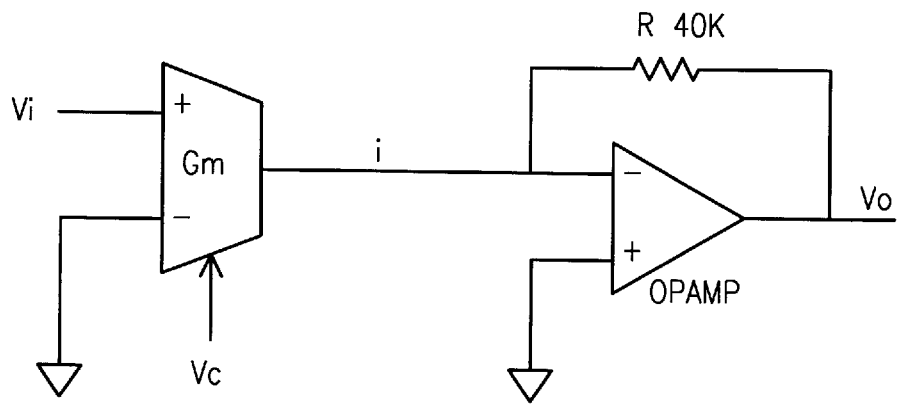
FIG. 1 is a prior art implementation of a gain stage ALC traditionally employed in coded speech circuitry applications.
Figure 1A:
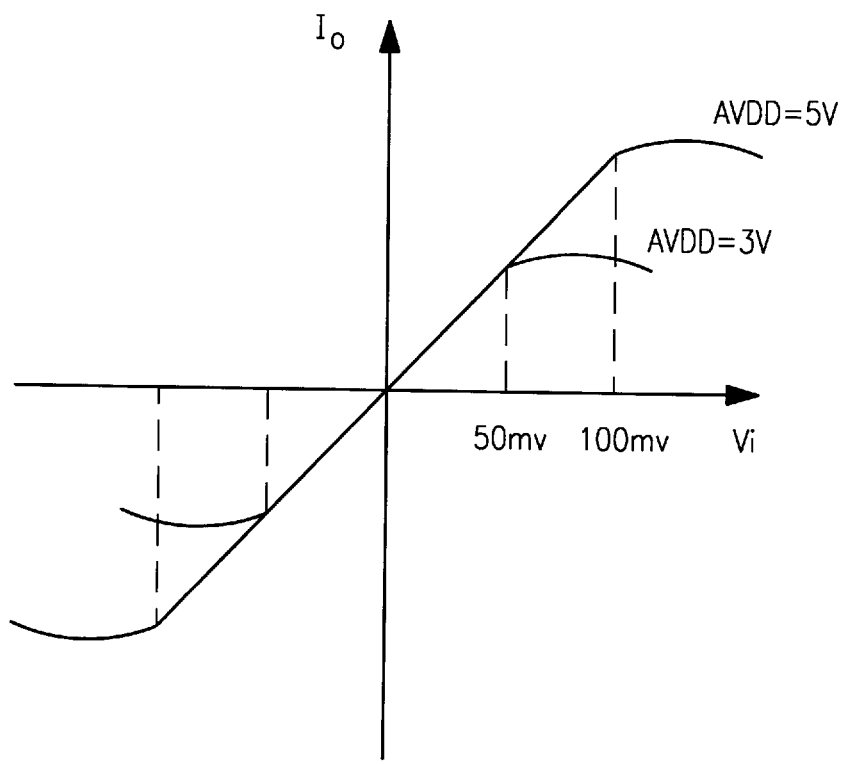
FIG. 1a is a graphical representation of Gm=I/V, illustrating in particular the linear range of operation.

Reference numbers refer to the same or equivalent parts of the present invention throughout the several figures of the drawing.

DESCRIPTION OF THE PREFERRED EMBODIMENT OF THE INVENTION

Figure 2:
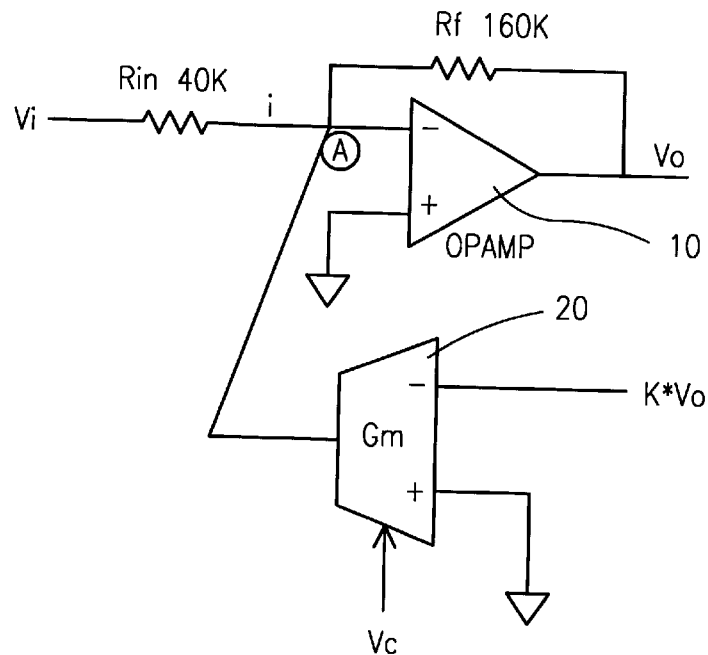
FIG. 2 shows a simplified circuit representation of the (WDR ALC) gain stage in accordance with the present invention.

FIG. 2 shows a simplified circuit representation of the (WDR ALC) gain stage in accordance with the present invention, comprising an OPAMP 10 having a voltage controlled IC transconductor (Gm) device 20 employed in a feedback loop. As configured, the input voltage $V_i$ produces input current i via resistor $R_{in}$ and then generates an output voltage $V_o$ through resistor $R_f$ and OPAMP 10, and circuit effects of voltage controlled IC transconductor (Gm) device 20 in the feedback loop. The feedback output current from transconductor (Gm) device 20 connected to node A now depends on voltage $K*V_o$ and control voltage $V_c$ and effectively sinks (sources) the total current via $R_f$. The transfer function for $V_o$ versus $V_i$ is derived as follows:

$$V_i/R_{in}+Gm_{Vc}*V_0*K+V_o/R_f=0 \qquad (4)$$

$$V_o/V_i=-(R_f/R_{in})*1/[1+Gm_{Vc}*R_f*K] \qquad (5)$$

The dependency of $V_o/V_i$ on transconductor (Gm) device 20 are minimized. The swings in input voltage $V_i$ now depend only on $R_{in}$ to produce input current i. Since the transconductor (Gm) device 20 is now in the feedback loop and its performance is not a major factor in the performance of the ALC, the nonlinearity of output signal $V_o$ can be reduced. The circuit configuration of FIG. 2 can be cascaded to enhance performance, which is not practical with the prior art configuration shown in FIG. 1.

Figure 3:
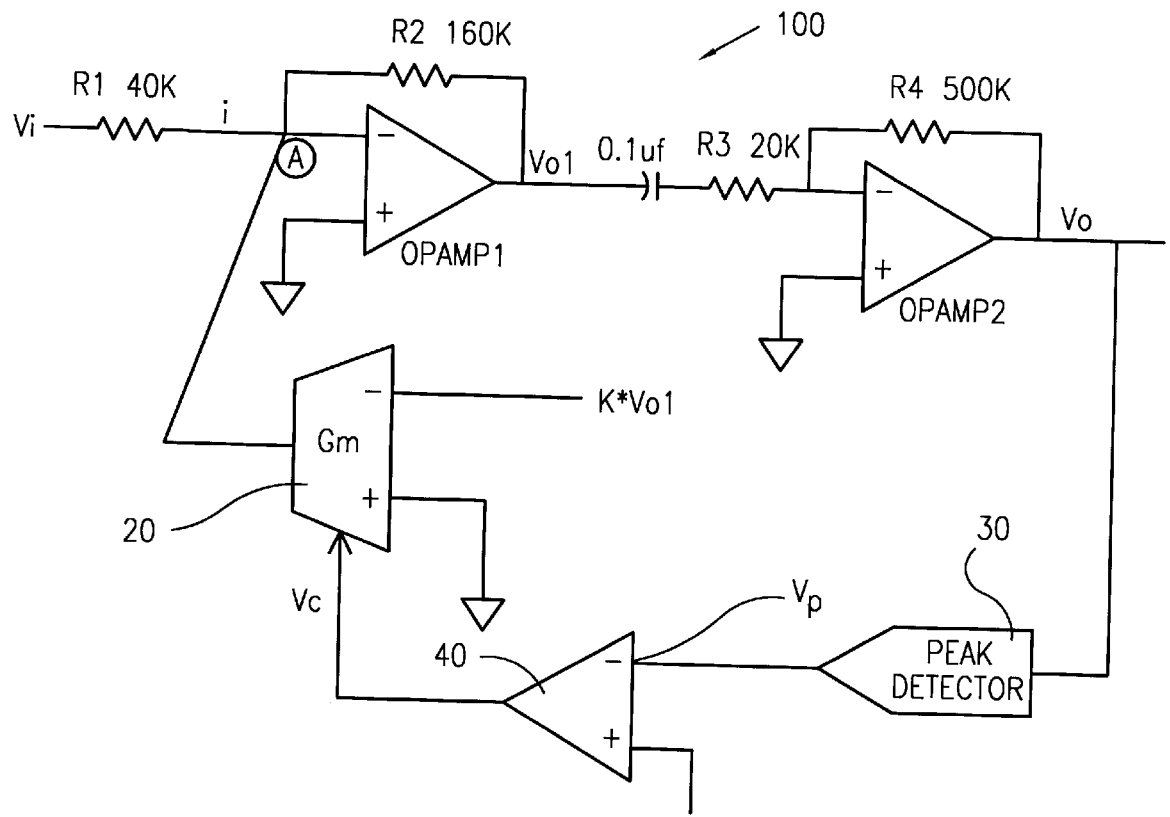
FIG. 3 shows a generalized circuit diagram representation of a two-opamp gain stage (WDR ALC) in accordance with the present invention.

FIG. 3 shows a generalized circuit diagram representation of a two-opamp gain stage (WDR ALC) circuit 100 for implementation in speech electronic circuitry applications. As shown, the first gain stage is formed by R1, R2 and OPAMP1 with transconductor (Gm) device 20 in the feedback loop, in accordance with the present invention. The first gain stage produces output voltage $V_o1$ which is further coupled to a second gain stage via ac coupling capacitor CC. The second gain stage comprises R3, R4 and OPAMP2, which produces output voltages $V_o$. A fraction K of output voltage $V_o$ is fed back to transconductor (Gm) device 20. As configured, transconductor (Gm) device 20 acts as a voltage controlled resistor that is effectively parallel with resistor R2. Output voltage $V_o$ is feedback via peak detector 30, which preferably has a fast response characteristic (fast attack time) and a slow release time for speech electronic circuitry applications. The output $V_p$ of peak detector 30 is compared with a predetermined voltage $V_{peak}$ at comparator/converter 40 which generates control voltage $V_c$. Control voltage $V_c$ is used to control the operation of transconductor (Gm) device 20. In operation of circuit 100, when the magnitude of input voltage $V_i$, as applied to the first gain stage, is increased, $V_o1$ is also increased. $V_o1$ is then ac coupled and amplified by the second gain stage to produce output voltage $V_o$. Peak detector produces $V_p$ in accordance with its response time characteristic. Comparator/converter 40 does not generate control voltage $V_c$ until $V_p$ exceeds $V_{peak}$ at which time transconductor (Gm) device 20 is activated. Upon being activated, transconductor (Gm) device 20 sinks a fraction of input current that is proportional to $V_o1$ which effectively reduces the gain of the first stage. The gain reduction of the first stage suppresses $V_o$ to control the total gain of the circuit.

The object of having an ALC being operational over a broad range of input voltages is accomplished by virtue of input voltage $V_i$ being applied directly to the first gain stage which is not affected by the transconductor (Gm) device 20. The lack of dependency of performance of the ALC on transconductor (Gm) device 20 results in simplifying the design of transconductor (Gm) device 20.

FIG. 3a shows the performance improvement from the point of view of total harmonic distortion (THD) versus input voltage swing. Under the same THD, the present invention shown in FIG. 3, curve (b), can sustain a much higher input voltage than that of the prior art, shown in FIG. 1, curve (a).

FIG. 4 shows a circuit diagram of OPAMP1, OPAMP2 as employed in WDR ALC circuit 100. in accordance with the present invention. OPAMP1, OPAMP2 are identical inverting type of amplifiers and are not sensitive to high input voltage swings. The two stage opamp topology as implemented is adequate for driving resistive loads, while the cascade structure is used to enhance the opamp's gain for reducing the circuit's nonlinearity.

FIG. 5 shows a circuit diagram of a voltage converter 40 as employed in WDR ALC circuit, in accordance with the present invention. The voltage $V_{peak}$ is predetermined by the circuit's gain transfer point. Output voltage $V_c$ is used to control transconductor (Gm) device 20.

FIG. 6 shows a circuit diagram of a voltage peak detector circuit 30 as employed in a (WDR ALC) in accordance with the present invention. The response time (attack time) and the release time are determined by external resistors Ra, Rr and capacitor Ca in accordance with the particular application.

Figure 7:
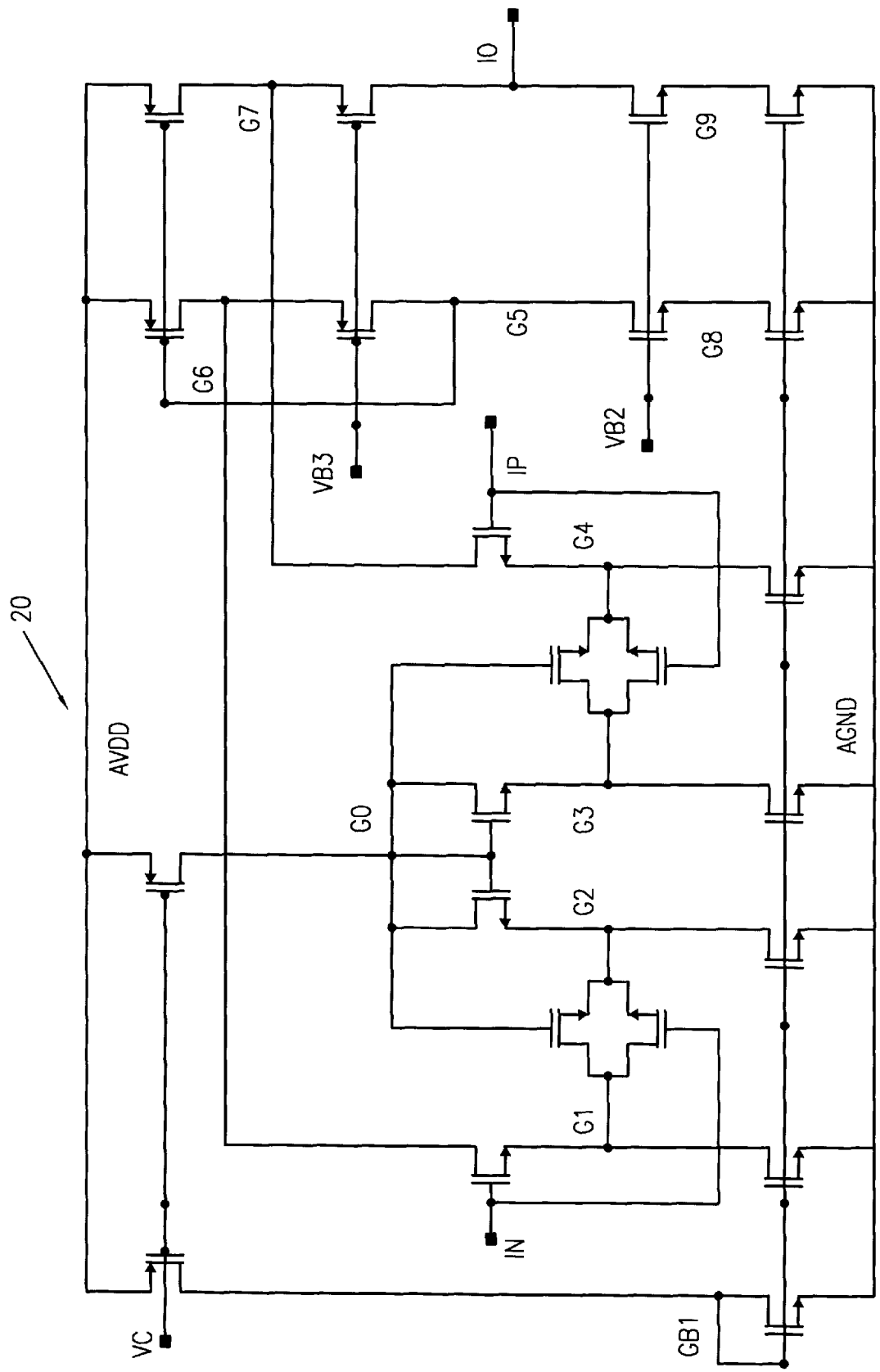
FIG. 7 shows a circuit diagram of a voltage controlled IC transconductor device as employed in a (WDR ALC) in accordance with the present invention.

FIG. 7 shows a circuit diagram of a voltage controlled IC transconductor device 20 as employed in a (WDR ALC) in accordance with the present invention. The bias currents are generated by, and depend upon $V_c$. The input transistors are MOS for higher transconductance gm. When the output voltage $V_p$ is below $V_{peak}$, $V_c$ is high and provides no bias current to the IC transconductor device 20. Otherwise, when the output voltage $V_p$ is above $V_{peak}$, $V_c$ is low and provides the bias current to activate the IC transconductor device 20 and thus automatically control $V_o$.

Therefore, while the present invention has been shown and described herein in what is believed to be the most practical and preferred embodiment, it is recognized that departures can be made therefrom within the scope of the invention, which is therefore not to be limited to the details disclosed herein but is to be accorded the full scope of the claims so as to embrace any and all equivalent apparatus.

We claim:

1. A control circuit apparatus having wide dynamic input voltage range response, said apparatus comprising:

at least one gain stage inverting operational amplifier circuit portion, said inverting operational amplifier circuit portion being responsive to an input supply voltage for generating an output voltage; and a transconductor circuit portion electrically coupled in a feedback loop from an output terminal of said inverting operational amplifier circuit portion to an input terminal of said inverting operational amplifier circuit portion, said transconductor circuit portion being responsive to peak output voltages from said inverting operational amplifier circuit portion to provide sink current that reduces a gain of said inverting operational amplifier circuit portion to control an output voltage gain of said apparatus, said at least one gain stage inverting operational amplifier circuit portion comprising a first inverting operational amplifier circuit portion and a second inverting operational amplifier circuit portion, said first and second inverting operational amplifier circuit portions being electrically coupled via an electronic means.

2. A control circuit apparatus as described in claim 1, wherein said transconductor circuit portion comprises being responsive to a bias voltage comprising a predetermined fraction of said output voltages from said inverting operational amplifier circuit portion.

3. A control circuit apparatus as described in claim 1, wherein:

said output voltage is compared to a threshold peak voltage such that when said output voltage is above said threshold peak voltage, said transconductor circuit portion being activated to provide a bias current to said inverting operational amplifier circuit portion to control operation of said apparatus.

4. A control circuit apparatus as described in claim 1, wherein:

said transconductor circuit portion comprises an integrated circuit having MOS input transistors.

5. A control circuit apparatus as described in claim 1, wherein:

said electronic means comprises at least one capacitor electrically coupled between an output of said first inverting operational amplifier circuit portion and an input of said second inverting operational amplifier circuit portion; and said apparatus further comprising:

a voltage peak detector member coupled to an output of said second inverting operational amplifier circuit portion;

a voltage comparator member coupled to an output of said peak detector member, said voltage comparator having an output electrically coupled to an input of said transconductor circuit portion, said voltage peak detector member and said voltage comparator member being responsive to an output signal from said second inverting operational amplifier circuit portion to generate a control signal that activates said transconductor circuit portion, said control signal being generated upon said output signal exceeding a predetermined threshold peak voltage, upon said transconductor circuit portion being activated, said transconductor circuit portion effects a gain reduction of said first inverting operational amplifier circuit portion that suppresses a increasing magnitude of said output signal.

6. A control circuit apparatus as described in claim 1, wherein:

said first and second inverting operational amplifier circuit comprises an integrated circuit having matching first and second inverting operational amplifier circuit portions.

7. A control circuit apparatus having wide dynamic input voltage range response, said apparatus comprising:

a first inverting operational amplifier circuit portion comprising a first gain stage, said first inverting operational amplifier circuit portion being responsive to at least one input voltage signal;

a second inverting operational amplifier circuit portion comprising a second gain stage, said second inverting operational amplifier circuit portion being responsive to an input voltage signal from said first inverting operational amplifier circuit portion for generating an output voltage signal; and a transconductor circuit portion electrically coupled in a feedback loop from an output terminal of said second inverting operational amplifier circuit portion to an input terminal of said first inverting operational amplifier circuit portion, said transconductor circuit portion being responsive to an over-voltage state of said output voltage signal to provide sink current that reduces a gain of said first and second gain stage portions to control an output voltage gain of said apparatus.

8. A control circuit apparatus as described in claim 7, wherein:

said first and second inverting operational amplifier circuit comprises an integrated circuit having matching first and second inverting operational amplifier circuit portions; and said transconductor circuit portion comprises an integrated circuit having MOS input transistor.

9. A control circuit apparatus as described in claim 7, wherein said apparatus further comprises:

an ac capacitor electrically coupling said first and second inverting operational amplifier circuit portions;

a voltage peak detector member electrically coupled to an output of said second inverting operational amplifier circuit portion;

a voltage comparator member electrically coupled to an output of said peak detector member, said voltage comparator having an output electrically coupled to an input of said transconductor circuit portion, said voltage peak detector member and said voltage comparator member being responsive to said output voltage signal from said second inverting operational amplifier circuit portion to generate a control signal that activates said transconductor circuit portion, said control signal being generated upon said output voltage signal exceeding a predetermined threshold peak voltage, upon said transconductor circuit portion being activated, said transconductor circuit portion effects a gain reduction of said first inverting operational amplifier circuit portion such that an increasing magnitude of said output voltage signal is suppressed.

* * * * *